(12) United States Patent
Lamansky et al.

(10) Patent No.: US 9,799,853 B2
(45) Date of Patent: Oct. 24, 2017

(54) EMISSIVE ARTICLE WITH LIGHT EXTRACTION FILM

(71) Applicant: 3M INNOVATIVE PROPERTIES COMPANY, St. Paul, MN (US)

(72) Inventors: Sergey Lamansky, Redmond, WA (US); Ghidewon Arefe, Coon Rapids, MN (US); Vivian W. Jones, Woodbury, MN (US); James M. Nelson, Lino Lakes, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/911,449

(22) PCT Filed: Aug. 8, 2014

(86) PCT No.: PCT/US2014/050361
§ 371 (c)(1),
(2) Date: Feb. 10, 2016

(87) PCT Pub. No.: WO2015/023536
PCT Pub. Date: Feb. 19, 2015

(65) Prior Publication Data
US 2016/0197311 A1    Jul. 7, 2016

Related U.S. Application Data

(60) Provisional application No. 61/864,782, filed on Aug. 12, 2013.

(51) Int. Cl.
*H01L 51/00* (2006.01)
*H01L 51/52* (2006.01)

(52) U.S. Cl.
CPC ...... *H01L 51/5281* (2013.01); *H01L 51/0093* (2013.01); *H01L 51/5275* (2013.01); *H01L 51/5284* (2013.01); *H01L 2251/303* (2013.01)

(58) Field of Classification Search
None
See application file for complete search history.

(56) References Cited

U.S. PATENT DOCUMENTS

| | | | |
|---|---|---|---|
| 6,605,483 B2 | 8/2003 | Victor | |
| 7,140,812 B2 | 11/2006 | Bryan | |

(Continued)

FOREIGN PATENT DOCUMENTS

| | | |
|---|---|---|
| JP | 2010-272465 | 12/2010 |
| KR | 2012-0007472 | 1/2012 |

(Continued)

OTHER PUBLICATIONS

International Search Report for PCT International Application No. PCT/US2014/050361, Nov. 19, 2014, 3 pages.

*Primary Examiner* — Joseph Schoenholtz
(74) *Attorney, Agent, or Firm* — Lisa P. Fulton

(57) ABSTRACT

An emissive article includes an OLED having a light emission surface, a circular polarizer, and a light extraction film optically between the OLED and the circular polarizer and being optically coupled to the light emission surface. The light extraction film includes a two-dimensional structured layer of extraction elements having a first index of refraction and a pitch in a range from 400 to 800 nm and a backfill layer including a material having a second index of refraction different from the first index of refraction.

24 Claims, 2 Drawing Sheets

(56) References Cited

U.S. PATENT DOCUMENTS

| | | | |
|---|---|---|---|
| 7,468,211 B2 | 12/2008 | McCormick | |
| 8,179,034 B2 * | 5/2012 | Potts | B82Y 20/00 |
| | | | 313/504 |
| 8,692,446 B2 | 4/2014 | Zhang | |
| 2005/0194896 A1 * | 9/2005 | Sugita | B82Y 20/00 |
| | | | 313/506 |
| 2007/0014020 A1 | 1/2007 | Bourdelais | |
| 2007/0020451 A1 | 1/2007 | Padiyath | |
| 2007/0230158 A1 | 10/2007 | Kitayama | |
| 2008/0074859 A1 | 3/2008 | Kitayama | |
| 2009/0015142 A1 | 1/2009 | Potts | |
| 2009/0066241 A1 | 3/2009 | Yokoyama | |
| 2010/0110551 A1 | 5/2010 | Lamansky | |
| 2010/0128351 A1 | 5/2010 | Epstein | |
| 2010/0289038 A1 | 11/2010 | Fukuda | |
| 2013/0051032 A1 | 2/2013 | Jones | |

FOREIGN PATENT DOCUMENTS

| | | |
|---|---|---|
| KR | 2012-0127897 | 11/2012 |
| WO | WO 2007/008775 | 1/2007 |
| WO | WO 2008-124711 | 10/2008 |
| WO | WO 2010/051229 | 5/2010 |

* cited by examiner

EMISSIVE ARTICLE WITH LIGHT EXTRACTION FILM

FIELD

The disclosure relates to emissive articles and, in particular, to emissive articles that includes a light extraction film providing enhanced luminance.

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

Emissive displays such as OLEDs commonly use anti-reflection films such as circular polarizers to reduce reflection from ambient light caused by the metallic layers of the OLED. A circular polarizer comprised of a linear absorbing polarizer and a ¼ wave film extinguishes a large amount of ambient light incident on the display.

The display brightness is a key attribute that bears a cost in the expense of electronic drive capacity and its associated bulk as well as the emitter lifetime. In addition, the display power efficiency is an important consumer regulatory counterbalance to display brightness.

In OLED devices, over 70% of the generated light is typically lost due to processes within the device structure. The trapping of light at the interfaces between the higher index organic and Indium Tin Oxide (ITO) layers and the lower index substrate layers is a cause of this poor extraction efficiency. Only a relatively small amount of the emitted light emerges through the transparent electrode as "useful" light. The majority of the light undergoes internal reflections, resulting in light being emitted from the edge of the device or trapped within the device and eventually being lost to absorption within the device after making repeated passes.

Light extraction films use internal nanostructures to avoid waveguiding losses within the device. While providing strong light extraction, internal nanostructures, including regular features such as photonic crystals or linear gratings or random features such as nanoparticles, tend to affect ambient contrast defined by a circular polarizer, which may not be desirable in final applications. In order to improve compatibility with a circular polarizer, it has been proposed to use low pitch nanostructures, for example, pitches between 200 nm and 380 nm as described in U.S. Pat. App. Pub. No. 2010/0289038. Alternatively it has been proposed to design OLED pixels such that nanostructures are located outside the emissive area of the subpixel as described, for example, in Japanese Pat. App. Pub. No. 2010272465. However, such approaches reduce the effectiveness of the extraction nanostructure. Thus, a need exists for a light extraction film that simultaneously enhances the efficiency of light extraction via the nanostructures, while also preserving light polarization for reflection extinction with a circular polarizer.

BRIEF SUMMARY

The disclosure relates to emissive articles and, in particular, to emissive articles that includes a light extraction film providing enhanced luminance. The light extraction film improves out-coupling of light from an OLED, for example while preserving light polarization for reflection extinction with a circular polarizer.

In a first aspect of the disclosure, an emissive article includes an OLED having a light emission surface, a circular polarizer, and a light extraction film optically between the OLED and the circular polarizer and being optically coupled to the light emission surface. The light extraction film includes a two-dimensional structured layer of extraction elements having a first index of refraction and a pitch in a range from 400 to 800 nm and a backfill layer including a material having a second index of refraction different from the first index of refraction. In one or more embodiments the light extraction film includes a non-birefringent substrate optically coupled to the structured layer. In one or more embodiments the light extraction film is separated from and not optically coupled to the circular polarizer. In one or more embodiments the non-birefringent substrate includes triacetyl cellulose. In one or more embodiments the non-birefringent substrate, light extraction film and optically coupling material form a composite film.

In one or more embodiments, the non-birefringent substrate has a linear retardance lower than 20 nm, or lower than 10 nm, or lower than 5 nm.

In one or more embodiments the light extraction film is optically coupled to the light emission surface via an optically coupling material having an index of refraction being equal to or greater than the first index of refraction. In one or more embodiments the optically coupling material comprises $TiO_2$ or $ZrO_2$.

In one or more embodiments the second index of refraction is greater than the first index of refraction. In one or more embodiments the light extraction film provides at least a 25% increase or at least a 100% increase in optical gain from the emissive article. In one or more embodiments the structured layer of two-dimensional extraction elements has at least two different zones of pitch two-dimensional extraction elements having at least two different pitch values.

In a second aspect of the disclosure, an emissive article including an OLED having a light emission surface, a circular polarizer and a light extraction film optically between the OLED and the circular polarizer and being optically coupled to the light emission surface with an optically coupling material. The light extraction film includes a non-birefringent substrate, a structured layer of two-dimensional extraction elements having a first index of refraction and a pitch in a range from 400 to 800 nm, the structured layer of extraction elements disposed on the non-birefringent substrate and a backfill layer including a material having a second index of refraction different from the first index of refraction. The backfill layer forms a planarizing layer over the extraction elements.

In one or more embodiments the optically coupling material has a refractive index equal to or greater than the first refractive index. In one or more embodiments the second index of refraction is greater than the first index of refraction. In one or more embodiments the structured layer of two-dimensional extraction elements has at least two different zones of pitch two-dimensional extraction elements having at least two different pitch values.

In one or more embodiments the non-birefringent substrate, light extraction film and optically coupling material form a composite film. In one or more embodiments the light extraction film is separated from and not optically coupled to the circular polarizer. In one or more embodiments the light extraction film provides at least a 25% increase or at least a 100% increase in optical gain from the emissive article.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
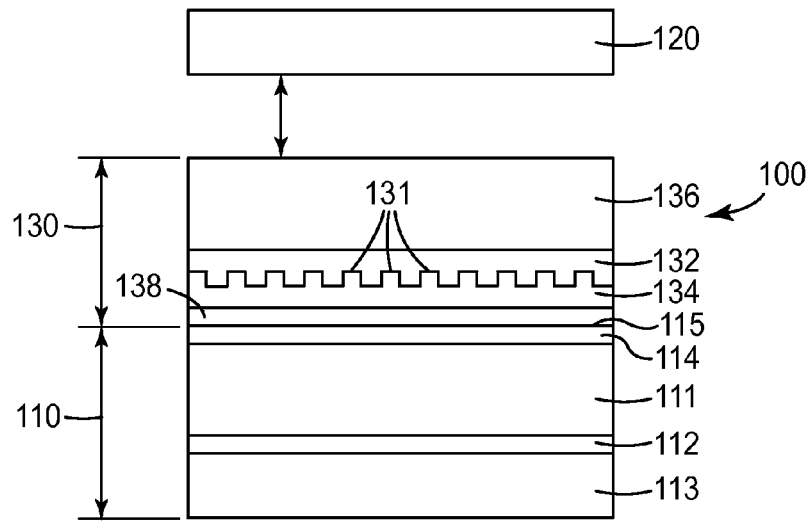
FIG. 1 is a schematic cross-sectional view of an emissive article.

In the following detailed description, reference is made to the accompanying drawings that form a part hereof, and in which are shown by way of illustration of several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The term "OLED" refers to an organic light emitting device. OLED devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

A "light extraction film" refers to a film or layer that improves light out-coupling from an OLED device while preserving light polarization for reflection extinction with a circular polarizer. A structured optical film can include engineered nanostructures (e.g., light extraction elements). The light extraction film" can include a substantially transparent substrate, low index nanostructures, and a high index backfill layer forming a substantially planar surface over the nanostructures. The term "substantially planar surface" means that the backfill layer planarizes the underlying layer, although slight surface variations may be present in the substantially planar surface. When the planar surface of the backfill layer is optically coupled to a light output or emission surface of the OLED device, the nanostructures at least partially enhance light output or out-coupling from the OLED device.

The terms "nanostructure" or "nanostructures" refers to structures having at least one dimension (e.g., height, length, width, or diameter) of less than 1 micrometer. Nanostructure includes, but is not necessarily limited to, particles and engineered features. The particles and engineered features can have, for example, a regular shape. Such particles are also referred to as nanoparticles. The term "nanostructured" refers to a material or layer having nanostructures.

The disclosure relates to emissive articles and, in particular, to emissive articles that includes a light extraction film providing enhanced luminance. The light extraction film improves out-coupling of light from an OLED, for example while preserving light polarization for reflection extinction with a circular polarizer. The light extraction film includes two dimensional (i.e., 2D) nanostructures that have a pitch in the visible light wavelength range and yet preserves light polarization. The emissive articles disclosed herein exhibit at least a 25% to 100% increase in optical gain, axial or integrated at all angles, when compared to emissive articles without the described light extraction film configuration. In addition, the emissive articles disclosed herein exhibit less than a 10% or 5% increase in axial ambient reflection of diffuse white light when compared to emissive articles without the described light extraction film configuration. While the present disclosure is not so limited, an appreciation of various aspects of the disclosure will be gained through a discussion of the examples provided below.

FIG. 1 is a schematic cross-sectional view of an emissive article 100. The illustrated emissive article 100 is a organic light emitting diode (OLED) 110 having a light emission surface 115. The emissive article 100 includes an OLED 110, a circular polarizer 120, and a light extraction film 130 optically between the OLED 110 and the circular polarizer 120. The light extraction film 130 is optically coupled to the light emission surface 115 of the OLED 110. The circular polarizer 120 is not optically coupled to or is separate from the light extraction film 130.

The light extraction film 130 is configured to preserve the polarization of light passing through the light extraction film 130. Preserving the polarization of light ensures that the ambient light extinction function of the circular polarizer 120. The light extraction film 130 is configured to improve emissive articles disclosed herein exhibit at least a 25% or 100% increase in optical gain, axial or integrated at all angles, when compared to emissive articles without the described light extraction film configuration. The light extraction film 130 is configured to improve the emissive articles disclosed herein exhibit less than a 10% or 5% increase in axial ambient reflection of diffuse light when compared to emissive articles without the described light extraction film configuration.

The light extraction film 130 includes a structured layer 132 of extraction elements 131 having a first index of refraction and a pitch in a visible light wavelength range or in a range from 400 to 800 nm. The light extraction film 130 includes a backfill layer 134 is a material having a second index of refraction different from the first index of refraction, and the backfill layer 134 forms a planarizing layer over the extraction elements 131. In many embodiments the second index of refraction is greater than the first index of refraction.

In one or more embodiments, the light extraction film 130 further includes a non-birefringent substrate 136 optically coupled to the structured layer 132. Examples of non-birefringent substrates 136 include substrates formed from triacetyl cellulose (TAC), polycarbonate and cyclic polyolefins using conditions and techniques that are generally known to those in the art.

Retardance may be defined as an integrated effect of a sample's birefringence acting along the path of a light beam. The magnitude of the linear retardance describes the difference in phase between the fastest and slowest linear polarization states in the material and is typically expressed as a length given by the difference in phase times the wavelength of light. Linear retardance can be measured using polarimeter systems such as, for example, AXOSCAN Mueller Matrix Polarimeter available from Axometrics, Inc., Huntsville Ala.

The OLED 110 can be any useful light emissive device. Considering the microcavity effect, OLEDs can be roughly categorized into two types, i.e., weak microcavity OLEDs and strong microcavity OLEDs. Conventional bottom emitting OLEDs are weak microcavity devices, while OLEDs with distributed Bragg reflectors or two metallic electrodes are considered as strong microcavity devices. Light emission properties, including the internal quantum efficiency, external quantum efficiency, exciton lifetime, and angular dependence, are distinct in the two types of OLEDs due to Fabri-Perot resonant cavity effect and the Purcell effect.

The illustrated emissive article 100 is a top emitting organic light emitting diode (OLED) 110. The illustrated organic light emitting diode (OLED) 110 includes an organic layer 111 separating a first electrode 112 and a second electrode 114. The OLED 110 can include a substrate or backplane layer 113. The organic layer 104 can be implemented with any organic electroluminescent material such as a light-emitting polymer as described in U.S. Pat. No. 6,605,483. The electrodes 112, 114 can be implemented with, for example, transparent conductive oxide (TCO) such as indium tin oxide (ITO) or metals.

The light extraction film 130 described herein can be a separate film applied to an OLED device. In one or more embodiments, an optical coupling layer 138 is used to optically couple the light extraction film 130 to a light output or light emission surface 115 of an OLED 110. The optical coupling layer 138 can be applied to the light extraction film 130, the OLED, or both, and it can be implemented with an adhesive to facilitate application of the light extraction film 130 to the OLED device. As an alternative to a separate optical coupling layer, the high index backfill layer itself may be comprised of a high index adhesive, so that the optical and planarizing functions of the backfill, and the adhering function of the adhesive optical coupling layer, are performed by the same layer. Examples of optical coupling layers and processes for using them to laminate light extraction films to OLED devices are described in U.S. patent application Ser. No. 13/050,324, entitled "OLED Light Extraction Films Having Nanoparticles and Periodic Structures," and filed Mar. 17, 2011, which is incorporated herein by reference.

In one or more embodiments, the optical coupling layer 138 has a refractive index that is greater than the first index of refraction for the structured layer 132. In one or more embodiments, the optical coupling layer 138 has a refractive index that is approximately equal to that of organic layers of OLED device 110. In some embodiments the optical coupling layer 138 comprises $TiO_2$ or $ZrO_2$.

The nanostructures for the light extraction film can be formed integrally with the substrate or in a layer applied to the substrate. For example, the nanostructures can be formed on the substrate by applying to the substrate a low-index material and subsequently patterning the material. Nanostructures are structures having at least one dimension, such as width, less than 1 micrometer.

The nanostructures for a light extraction film can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 1 micrometer. One-dimensional structures include, for example, continuous or elongated prisms or ridges, or linear gratings.

In one or more embodiments, the nanostructures for a light extraction film are two-dimensional (2D), meaning they are periodic in two dimensions, that is, nearest neighbor features are spaced equally in two different directions along the surface. In the case of 2D nanostructures, the spacing in both directions is less than 1 micrometer. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Pat. Application Publication No. 2010/0128351, which is incorporated herein by reference as if fully set forth.

In one or more embodiments, the nanostructures for a light extraction film are two-dimensional extraction elements. In these embodiments, the nanostructures have a pitch in a range from 400 to 800 nm or from 400 to 600 nanometers, or from 500 to 700 nanometers, or from 600 to 800 nanometers.

In one or more embodiments, the nanostructures for a light extraction film are engineered nanostructures having multi-periodic zones. FIGS. 2A-2E illustrates various exemplary configurations of zones of multi-periodic nanostructures having at least different pitches. A zone is a plurality of sets of engineered nanostructures proximate one another and non-overlapping. The sets can be directly adjacent one another, or adjacent one another and separated by a gap. Each set is a plurality of nanostructures adjacent one another with a periodic characteristic, and each set in a zone has a different periodic characteristic from the other sets in the zone. The engineered nanostructures in each set are thus not random and are not non-periodic. The zone repeats throughout the nanostructured surface of the light extraction film. In particular, the same plurality of sets in a zone repeats, resulting in a repeating variable periodic characteristic of the engineered nanostructures. The plurality of nanostructures in a set can include as few as two nanostructures, in which case the pitch (when used as the multi-periodic characteristic) is only the single distance between the two nanostructures in the set.

Examples of periodic characteristics include pitch, height, aspect ratio, and shape. Pitch refers to the distance between adjacent nanostructures, typically measured from their topmost portions. Height refers to the height of the nanostructures measured from their base (in contact with the underlying layer) to the topmost portion. Aspect ratio refers to the ratio of the cross-sectional width (widest portion) to height of the nanostructures. Shape refers to the cross-sectional shape of the nanostructures.

Controlling pitch through multi-pitch zones has been found to provide better angular distribution of OLED light extraction when compared with using a single pitch. Also, using multi-pitch zones provides for more uniform OLED light extraction and allows for tuning the light extraction for specific colors. The light extraction films thus use multi-periodic zones of pitch and may combine the multi-pitch zones with other multi-periodic characteristics such as those described above.

Figure 2A:
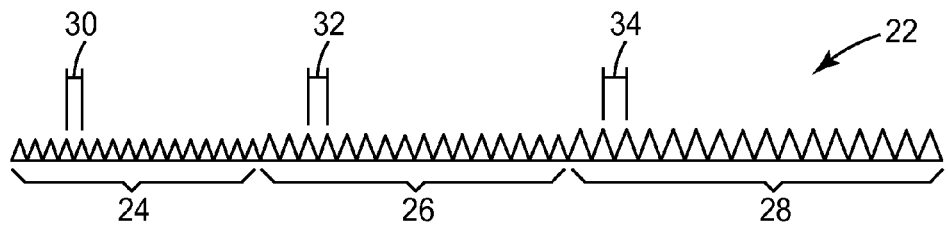
FIGS. 2A-2E illustrate various exemplary configurations of zones of multi-periodic nanostructures having at least different pitches.

FIG. 2A illustrates engineered nanostructures 22 with a zone having sets 24, 26, and 28. Each of the sets 24, 26, and 28 has a different pitch and feature height compared to the pitches and feature heights of the other sets in the zone. Set 24 has a periodic pitch 30, set 26 has a periodic pitch 32, and set 28 has a periodic pitch 34. The pitches 30, 32, and 34 do not equal each other. In one particular embodiment, pitch 30=0.420 microns, pitch 32=0.520 microns, and pitch 34=0.630 microns. The sets 24, 26, and 28 constituting the zone would then repeat to form the nanostructured surface of the light extraction film.

Figure 2B:
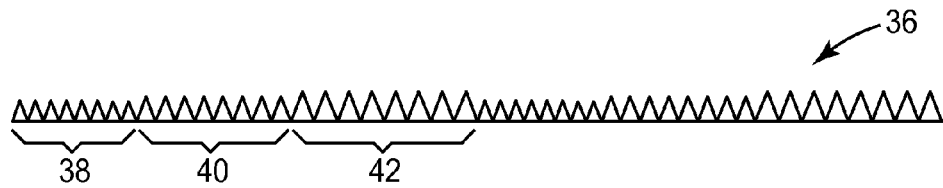

FIG. 2B illustrates engineered nanostructures 36 with a repeating zone having sets of nanostructures 38, 40, and 42 each having a periodic pitch and feature height different from the other sets. In nanostructured surface 36, the zone is shown repeated twice. This example has fewer features in each set compared with the sets in FIG. 2A.

Figure 2C:
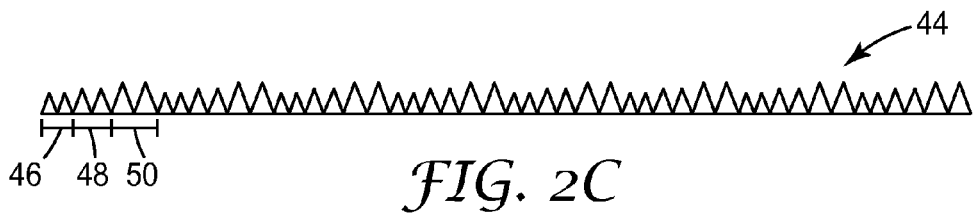

FIG. 2C illustrates engineered nanostructures 44 with a repeating zone having sets of nanostructures 46, 48, and 50 each having a periodic pitch and feature height different from the other sets. In nanostructured surface 44, the zone is shown repeated eight times. This example has fewer features in each set compared with the sets in FIGS. 2A and 2B.

Figure 2D:

FIG. 2D illustrates engineered nanostructures 52 with a repeating zone having sets of nanostructures 54 and 56 each having periodic a pitch and feature height different from the other set. In nanostructured surface 52, the zone is shown repeated three times. This example illustrates a zone having two sets compared with the zones having three sets in FIGS. 2A-2C.

Figure 2E:
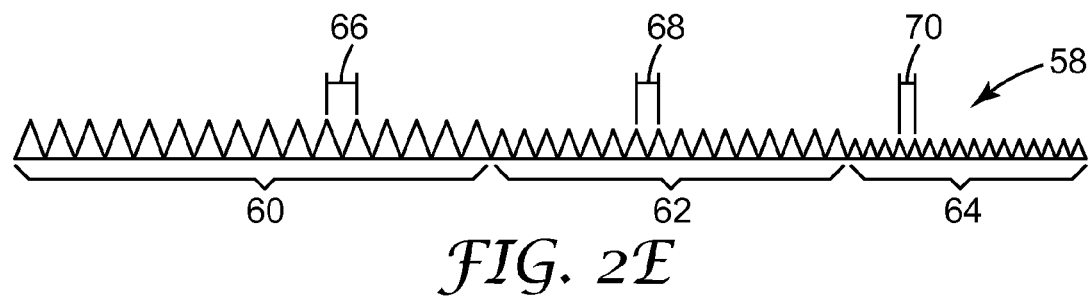

FIG. 2E illustrates engineered nanostructures 58 with a zone having sets 60, 62, and 64. Each of the sets 60, 62, and 64 has a different pitch and feature height compared to the pitches and feature heights of the other sets in the zone. Set 60 has a periodic pitch 66, set 62 has a periodic pitch 68, and set 64 has a periodic pitch 70. The pitches 66, 68, and 70 do not equal each other. In one particular embodiment, pitch 66=0.750 microns, pitch 68=0.562 microns, and pitch 70=0.375 microns. The sets 60, 62, and 64 constituting the zone would then repeat to form the nanostructured surface of the light extraction film. This example illustrates a varying pitch in a zone increasing in a different direction compared with the varying pitch in the sets of FIG. 2A.

Aside from pitch and feature height, multi-periodic zones can have sets of other multi-periodic characteristics. FIG. 2F illustrates engineered nanostructures 72 having sets with multi-periodic aspect ratios. The repeating zone for nanostructures 72 includes sets 74 and 76 with the nanostructures in set 74 having a different aspect ratio from the nanostructures in set 76. As another example, FIG. 2G illustrates engineered nanostructures 78 having sets with multi-periodic shapes. The repeating zone for nanostructures 78 includes sets 80 and 82 with the nanostructures in set 80 having a different shape from the nanostructures in set 82. In this example, the nanostructures in set 80 can be implemented with 1D square ridges or 2D square posts, while the nanostructures in set 82 can be implemented with 1D elongated prisms or 2D pyramids.

The nanostructures in FIGS. 2A-2G are illustrative of periodic characteristics and zones. A zone can have two, three, or more sets of nanostructures with a periodic characteristic in each set and different from the values of the same periodic characteristic in the other sets. In FIGS. 2A-2E, the different pitches among sets in a zone are accomplished using nanostructures of different heights. However, the height of the nanostructures can be the same while the pitch among sets is different. The sets in a zone can thus have one or more different periodic characteristics among them. Also, FIGS. 2A-2E show prisms (or pyramids) as the engineered nanostructures for illustrative purposes; engineered nanostructures can include other types of 1D and 2D features such as those identified above.

Materials for the substrates, low index structures, and high index backfill layers for light extraction film are provided in the published patent applications identified above. For example, the substrate can be implemented with glass, PET, polyimides, TAC, PC, polyurethane, PVC, or flexible glass. Processes for making light extraction film are also provided in the published patent applications identified above. Optionally, the substrate can be implemented with a barrier film to protect a device incorporating the light extraction film from moisture or oxygen. Examples of barrier films are disclosed in U.S. Pat. Application Publication No. 2007/0020451 and U.S. Pat. No. 7,468,211, both of which are incorporated herein by reference.

Conventional circular polarizers are used on emissive displays to reduce reflections from ambient light. One disadvantage of this circular polarizer is that emitted light is reduced by 50% or more. There are some display applications where higher emitted luminance efficiency is very desirable for enabling longer lifetime of the emissive display or improving displayed visual quality. Thus increasing luminous efficiency of the OLED is desired.

In some display applications, ambient light is lower, such as TVs in the home, and requirements for reducing ambient light reflections are lessened. In some embodiments of the present disclosure, the luminance efficiency increase of the emissive display relative to one without the light extraction film configuration described herein may be at least 25% greater, or at least 100% greater or at least 150% greater when measured axially or integrated over all angles. These gains in luminance efficiency are achieved without substantially increasing glare caused by ambient light compared to an emissive display without the light extraction film configuration described herein. In some embodiments of the present disclosure, the ambient light reflection is not more than 10% greater than emissive display without the light extraction film configuration described herein, or not more than 5% greater than emissive display without the light extraction film configuration described herein.

Some of the advantages of the disclosed emissive articles are further illustrated by the following examples. The particular materials, amounts and dimensions recited in this example, as well as other conditions and details, should not be construed to unduly limit the present disclosure.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

| Materials | | |
|---|---|---|
| Product Name | Description | Available from |
| IRGACURE 184 | Photoinitiator | Ciba Specialty Chemicals, Tarrytown, NY |
| PHOTOMER 6210 | aliphatic urethane diacrylate | Cognis Corporation, Cincinnati, OH |
| SOLPLUS D510 | polyester-polyamine copolymer | Lubrizol, Cleveland, OH |
| SR238 | 1,6 hexanediol diacrylate | Sartomer Company, Exton, PA |
| SR833S | difunctional acrylate monomer | Sartomer Company, Exton, PA |
| TAC Film | 75 micrometer (3 mil) thick cellulose triacetate having a linear birefringence in the range of 1.5 nm-4.0 nm as determined using a AXOSCAN Mueller Matrix Polarimeter available from Axometrics, Inc., Huntsville AL | Island Pyrochemical Industries, Mineola, NY |
| PET Film | 125 micrometer (5 mil) thick polyethylene terephthalate having a linear birefringence in the range of 3000 nm-6000 nm as determined using a AXOSCAN Mueller Matrix Polarimeter available from Axometrics, Inc., Huntsville AL | 3M Company, St Paul, MN |
| Circular Polarizer | Ambient contrast film solution | LGD, Seoul, South Korea |

Reflectivity Measurements

An Autronics-Melchers GmbH (Karlsruhe, Germany) ConoScope 80 was used to measure diffuse reflectance. The tungsten-halogen white light with infrared filters provided with the ConoScope was used as the light source. The sample under measurement was placed directly under the ConoScope lens/light source apparatus at a close working distance (approximately 2 mm) Incident light was reflected off the sample and detected with a photomultiplier tube at near normal incidence (a polar angle of about 0 degrees).

Preparative Examples

Preparation of D510 Stabilized 50 nm $TiO_2$ Nanoparticle Dispersions

A $TiO_2$ nanoparticle dispersion with an approximately 52% wt of $TiO_2$ was prepared using a milling process in the presence of SOLPLUS D510 and 1-methoxy-2-propanol. The SOLPLUS D510 was added in an amount of 25% wt based on $TiO_2$ weight. The mixture was premixed using a DISPERMAT mixer (Paul N. Gardner Company, Inc., Pompano Beach, Fla.) for 10 minutes and then a NETZSCH MiniCer Mill (NETZSCH Premier Technologies, LLC., Exton, Pa.) was used with the following conditions: 4300 rpm, 0.2 mm YTZ milling media, and 250 ml/min flow rate. After 1 hour of milling, a white paste-like $TiO_2$ dispersion in 1-methoxy-2-propanol was obtained. The particle size was determined to be 50 nm (Z-average size) using a Malvern Instruments ZETASIZER Nano ZS (Malvern Instruments Inc, Westborough, Mass.).

Preparation of High Index Backfill Solution (HI-BF)

20 g of D510 stabilized 50 nm $TiO_2$ solution, 2.6 g of SR833S, 0.06 g of IRGACURE 184, 25.6 g of 1-methoxy-2-propanol, 38.4 g of 2-butanone were mixed together to form a homogenous high index backfill solution.

Fabrication of Nanostructured Film

A structured film was fabricated by first making a multi-tipped diamond tool as described in U.S. Pat. No. 7,140,812 (using a synthetic single crystal diamond, Sumitomo Diamond, Japan).

The diamond tool was then used to make a copper micro-replication roll which was then used to make nanostructures on a TAC film or a PET film in a continuous cast and cure process utilizing a polymerizable resin made by mixing 0.5% (2,4,6 trimethyl benzoyl)diphenyl phosphine oxide into a 75:25 blend of PHOTOMER 6210 and SR238.

Fabrication of Nanostructured Film With Backfill

A structured film was prepared as previously described. HI-BF solution was coated onto the structured film using a roll to roll coating process with a web speed of 4.5 m/min (15 ft/min) and a dispersion delivery rate of 5.1 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 4.5 m/min (15 ft/min).

Comparative Example C1-C12

1D Structures Without Backfill and Without Optical Coupling Layer (OCL)

A Samsung Galaxy S phone (available from Samsung Mobile Display Co., South Korea) was obtained. The display panel, which included a circular polarizer attached to an encapsulation glass positioned above OLED/mirror layers, was removed. The OLED/mirror layers included the organic layers, a thin top electrode, a reflective bottom electrode, the backplane and glass.

1D structured films having triangular "sawtooth" patterns were prepared as described in "Fabrication of Nanostructured Film." Samples with pitches from 150 nm to 700 nm were prepared (see table below). Samples were prepared where the height of the triangles equal to the width and samples where the height of the triangle was larger than the width were prepared. No backfill was applied to these samples and TAC film was used as the substrate.

Assemblies were made by placing a 1D structured film over an OLED/mirror from a Samsung Galaxy S with the structured surface facing the OLED/mirror. A circular polarizer was then placed over the structured film and the reflected luminance was measured as described in "Reflectivity Measurements". No adhesive was added between the layers.

For comparison, a sample with a TAC film having no structure placed between the circular polarizer and OLED/mirror layer was prepared. A baseline sample with no film placed between the circular polarizer and the OLED/mirror was also prepared. The reflectivity of the sample with the TAC layer was similar to the baseline result.

The results, which are given in the table below, indicated that a pitch of less than about 300 nm was needed to reduce the reflected luminance to close to the baseline result.

| Example | Film | Pitch (nm) | Height (nm) | On-Axis Reflected Luminance, cd/m² |
|---------|------|------------|-------------|-----------------------------------|
| C1 | No additional film (Reference) | N/A | N/A | 58.2 |
| C2 | Unstructured TAC | N/A | N/A | 56.3 |
| C3 | TAC with structured surface | 150 | 150 | 57.4 |
| C4 | TAC with structured surface | 250 | 250 | 63.6 |
| C5 | TAC with structured surface | 300 | 300 | 57.9 |
| C6 | TAC with structured surface | 300 | 600 | 67.5 |
| C7 | TAC with structured surface | 400 | 400 | 84.6 |
| C8 | TAC with structured surface | 500 | 500 | 106.9 |
| C9 | TAC with structured surface | 600 | 600 | 97.6 |
| C10 | TAC with structured surface | 600 | 1200 | 141.4 |
| C11 | TAC with structured surface | 700 | 700 | 103.1 |
| C12 | TAC with structured surface | Multipitch: 400 nm, 500 nm and 600 nm | Multipitch: 400 nm, 500 nm and 600 nm | 89.4 |

Comparative Examples C13-C15

2D Structures Without Backfill and Without OCL

Samples were made as in Comparative Examples C1-C12, except that 2-D structured films with 500 nm pitch and triangular shaped structures were used instead of 1-D structured film. Samples were made on both TAC and PET substrates.

Samples were prepared by applying the extraction film over the mirror and a circular polarizer over the extraction film with no adhesive between the layers as described for Comparative Examples C1-C12. Reflectivity measurements were performed as previously described. The data, which is reported in the table below, indicated that reflectance was significantly reduced with 2D symmetric 500 nm pitch extractors compared to 1D extractors having a similar pitch. The data also indicated that the birefringence of PET base film increases reflectance by approximately a factor of two compared to low birefringence TAC films.

| Example | Film | On-Axis Reflected Luminance, cd/m² |
|---------|------|-----------------------------------|
| C1 | No additional film (Reference) | 57.9 |
| C2 | Unstructured TAC | 59.5 |
| C13 | Unstructured PET | 160.0 |
| C14 | TAC with 2D 500 nm symmetric structure | 78.7 |
| C15 | PET with 2D 500 nm symmetric structure | 144.4 |

Examples 1 and 2 and Comparative Examples C16-C28

A mirror was constructed by depositing via thermal evaporation 2 nm of chromium on glass, 100 nm of silver onto the chromium and then over-coating the silver with 200 nm of molybdenum oxide ($MoO_3$). The mirror was constructed to mimic the reflectance of an OLED/mirror layer.

Samples were prepared by applying the extraction film over the mirror and a circular polarizer over the extraction film with no adhesive between the layers as described for Comparative Examples C1-C12. These samples are denoted "air gap" in the table below. Samples were also prepared where an optical coupling layer was used to laminate the extraction film to the mirror. The circular polarizer was applied over the extraction film without adhesive leaving an air gap between the extractor film and the circular polarizer. These samples are denoted "OCL" in the table below.

The OCL used was 70% ZrO Reflectivity measurements were performed as previously described. The data, which is provided in the table below, indicated that reflectance was significantly reduced for 2D symmetric extractors on a low birefringence substrate (TAC) coupled to the OLED with an OCL compared to other extractors.

| Example | Film | Film Structure | Air Gap or OCL | On-Axis Reflected Luminance, cd/m² |
|---------|------|----------------|----------------|-----------------------------------|
| C1 | No additional film (Reference) | N/A | Air Gap | 53.5 |

-continued

| Example | Film | Film Structure | Air Gap or OCL | On-Axis Reflected Luminance, cd/m² |
|---|---|---|---|---|
| C2 | Unstructured TAC | N/A | Air Gap | 53.7 |
| C16 | Unstructured TAC | N/A | OCL | 53.8 |
| C17 | TAC with structured surface | 1D with backfill, 2:1 aspect ratio 600 nm | Air Gap | 91.5 |
| C18 | TAC with structured surface | 1D with backfill, 2:1 aspect ratio 600 nm | OCL | 63.8 |
| C19 | TAC with structured surface | 1D with hybrid backfill, 2:1 aspect ratio 600 nm | Air Gap | 78.8 |
| C20 | TAC with structured surface | 1D with hybrid backfill, 2:1 aspect ratio 600 nm | OCL | 60.7 |
| C21 | TAC with structured surface | 2D with backfill, symmetric 500 nm | Air Gap | 66.4 |
| 1 | TAC with structured surface | 2D with backfill, symmetric 500 nm | OCL | 54.8 |

This measurement was repeated using a different set of films but with the same Ag mirror construction, OCL and measurement methods.

| Example | Film | Film Structure | Air Gap or OCL | On-Axis Reflected Luminance, cd/m² |
|---|---|---|---|---|
| C1 | No additional film (Reference) | N/A | Air Gap | 57.2 |
| C2 | Unstructured TAC | N/A | Air Gap | 59.0 |
| C22 | TAC with structured surface | 1D with backfill, 1:1 aspect ratio 400 nm | Air Gap | 69.8 |
| C23 | TAC with structured surface | 1D with backfill, 1:1 aspect ratio 400 nm | OCL | 64.2 |
| C24 | TAC with structured surface | 1D with backfill, 2:1 aspect ratio, multi-pitch 300/400 nm | Air Gap | 82.4 |
| C25 | TAC with structured surface | 1D with backfill, 2:1 aspect ratio, multi-pitch 300/400 nm | OCL | 65.7 |
| C26 | TAC with structured surface | 1D with backfill, 1:1 aspect ratio, multi-pitch 300/400 nm | Air Gap | 82.0 |
| C27 | TAC with structured surface | 1D with backfill, 1:1 aspect ratio, multi-pitch 300/400 | OCL | 66.5 |
| C28 | TAC with structured surface | 2D with backfill, multi-pitch 400/500/600 nm | Air Gap | 71.3 |
| 2 | TAC with structured surface | 2D with backfill, multi-pitch 400/500/600 nm | OCL | 58.3 |

Thus, embodiments of EMISSIVE ARTICLE WITH LIGHT EXTRACTION FILM are disclosed. One skilled in the art will appreciate that the compositions described herein can be practiced with embodiments other than those disclosed. The disclosed embodiments are presented for purposes of illustration and not limitation.

What is claimed is:

1. An emissive article comprising:
   an OLED having a light emission surface;
   a circular polarizer; and
   a light extraction film optically between the OLED and the circular polarizer and being optically coupled to the light emission surface, the light extraction film comprising:
     a structured layer of two-dimensional extraction elements having a first index of refraction and a pitch in a range from 400 to 800 nm;
     a backfill layer comprising a material having a second index of refraction different from the first index of refraction, wherein the backfill layer forms a planarizing layer over the extraction elements, wherein the light extraction film further comprises a non-birefringent substrate optically coupled to the structured layer.

2. The emissive article of claim 1, wherein the non-birefringent substrate has a linear retardance of less than 20 nm.

3. The emissive article of claim 2, wherein the non-birefringent substrate has a linear retardance of less than 10 nm.

4. The emissive article of claim 3, wherein the non-birefringent substrate has a linear retardance of less than 5 nm.

5. The emissive article of claim 1, wherein the light extraction film is separated from and not optically coupled to the circular polarizer.

6. The emissive article of claim 1, wherein the light extraction film is optically coupled to the light emission surface via an optically coupling material having an index of refraction being equal to or greater than the first index of refraction.

7. The emissive article of claim 1, wherein the second index of refraction is greater than the first index of refraction.

8. The emissive article of claim 1, wherein the non-birefringent substrate comprises triacetyl cellulose.

9. The emissive article of claim 1, wherein the light extraction film provides at least a 25% increase in optical gain from the emissive article.

10. The emissive article of claim 8, wherein the light extraction film provides at least a 100% increase in optical gain from the emissive article.

11. The emissive article of claim 6, wherein the non-birefringent substrate, light extraction film and optically coupling material form a composite film.

12. The emissive article of claim 6, wherein the optically coupling material comprises $TiO_2$ or $ZrO_2$.

13. The emissive article of claim 1, wherein the structured layer of two-dimensional extraction elements has at least two different zones of pitch two-dimensional extraction elements having at least two different pitch values.

14. An emissive article comprising:
   an OLED having a light emission surface;
   a circular polarizer; and
   a light extraction film optically between the OLED and the circular polarizer and being optically coupled to the light emission surface with an optically coupling material, the light extraction film comprising:

non-birefringent substrate;
  a structured layer of two-dimensional extraction elements having a first index of refraction and a pitch in a range from 400 to 800 nm, the structured layer of extraction elements disposed on the non-birefringent substrate;
  a backfill layer comprising a material having a second index of refraction different from the first index of refraction, wherein the backfill layer forms a planarizing layer over the extraction elements.

15. The emissive article of claim 14, wherein the non-birefringent substrate has a linear retardance of less than 20 nm.

16. The emissive article of claim 15, wherein the non-birefringent substrate has a linear retardance of less than 10 nm.

17. The emissive article of claim 16, wherein the non-birefringent substrate has a linear retardance of less than 5 nm.

18. The emissive article of claim 14, wherein the optically coupling material has a refractive index greater than the first refractive index.

19. The emissive article of claim 14, wherein the non-birefringent substrate, light extraction film and optically coupling material form a composite film.

20. The emissive article of claim 14, wherein the structured layer of two-dimensional extraction elements has at least two different zones of pitch two-dimensional extraction elements having at least two different pitch values.

21. The emissive article of claim 14, wherein the light extraction film is separated from and not optically coupled to the circular polarizer.

22. The emissive article of claim 14, wherein the second index of refraction is greater than the first index of refraction.

23. The emissive article of claim 14, wherein the light extraction film provides at least a 25% increase in optical gain from the emissive article.

24. The emissive article of claim 23, wherein the light extraction film provides at least a 100% increase in optical gain from the emissive article.

* * * * *